United States Patent
Heo et al.

(10) Patent No.: US 8,779,426 B2
(45) Date of Patent: Jul. 15, 2014

(54) THIN FILM TRANSISTOR

(75) Inventors: Jae-Seok Heo, Namyangju-si (KR); Ji-Yeon Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 12/834,671

(22) Filed: Jul. 12, 2010

(65) Prior Publication Data

US 2011/0156021 A1  Jun. 30, 2011

(30) Foreign Application Priority Data

Dec. 31, 2009 (KR) .................. 10-2009-0135447

(51) Int. Cl.
*H01L 29/04* (2006.01)

(52) U.S. Cl.
USPC .......... 257/57; 257/59; 257/66; 257/E51.005; 257/E29.137; 438/30; 438/149; 438/158

(58) Field of Classification Search
USPC ............... 257/359, E27.1, E29.117, E29.137
See application file for complete search history.

(56) References Cited

U.S. PATENT DOCUMENTS

| | | | |
|---|---|---|---|
| 2006/0086936 A1* | 4/2006 | Hoffman et al. | 257/66 |
| 2008/0296568 A1 | 12/2008 | Ryu et al. | |
| 2009/0236596 A1* | 9/2009 | Itai | 257/43 |
| 2010/0133530 A1* | 6/2010 | Akimoto et al. | 257/43 |
| 2011/0057185 A1* | 3/2011 | Peng et al. | 257/43 |
| 2011/0181561 A1* | 7/2011 | Smith | 345/204 |

FOREIGN PATENT DOCUMENTS

| | | |
|---|---|---|
| CN | 1906770 A | 1/2007 |
| CN | 101350313 A | 1/2009 |

OTHER PUBLICATIONS

S.J. Pearton et al, Transparent Thin Film Transistors Based on InZnO for Flexible Electronics, Trans Tech Publication, vol. 380 (Mar. 2008), pp. 99-109.*

* cited by examiner

*Primary Examiner* — Steven Loke
*Assistant Examiner* — Cuong B Nguyen
(74) *Attorney, Agent, or Firm* — Birch, Stewart, Kolasch & Birch, LLP

(57) ABSTRACT

A thin film transistor for increasing the conductivity of a channel region and suppressing the leakage current of a back channel region, and a display device including the thin film transistor, are discussed. According to an embodiment, the thin film transistor includes a gate electrode arranged on a substrate, a source electrode and a drain electrode spaced from each other on the substrate, a gate insulating film to insulate the gate electrode from the source electrode and the drain electrode, and a semiconductor layer insulated from the gate electrode through the gate insulating film, the semiconductor layer including a channel region and a back channel region, the semiconductor layer made of $(In_2O_3)_x(Ga_2O_3)_y(ZnO)_z$ ($0 \leq x \leq 5$, $0 \leq y \leq 5$, $0 \leq z \leq 5$), wherein X or Z is greater than Y in the channel region of the semiconductor layer, and Y is greater than X and Z in the back channel region of the semiconductor layer.

11 Claims, 4 Drawing Sheets

THIN FILM TRANSISTOR

This application claims the priority benefits of Korean Patent Application No. 10-2009-0135447, filed on Dec. 31, 2009, which is hereby incorporated by reference as if fully set forth herein.

BACKGROUND OF THE INVENTION

1. Field of the Invention

The present invention relates to a thin film transistor, and more specifically, to a thin film transistor for increasing the conductivity of a channel region and suppressing the leakage current of a back channel region.

2. Discussion of the Related Art

In accordance with the increased demand for various forms of display devices for information-dependent users, a great deal of research is being actively conducted on flat display devices such as liquid crystal displays (LCDs), plasma display panels (PDPs), electro luminescent displays (ELDs), field emission displays (FEDs), and vacuum fluorescent displays (VFDs).

A thin film transistor (TFT) having a channel region provided on a semiconductor layer arranged on a substrate having an insulating surface is widely utilized as a switching device of each pixel constituting a display device such as an LCD.

Current-voltage properties of the thin film transistor generally used for display devices is affected by factors such as the characteristics of the semiconductor layer and the gate insulating film in the thin film transistor, the interface properties between the gate insulating film and the semiconductor layer, ohmic contact properties between the semiconductor layer and the source-drain electrode in the thin film transistor, and field effect electron mobility.

When a voltage not lower than a threshold voltage is applied to the gate electrode of the thin film transistor, mobile carriers (free electrons) are induced to the semiconductor layer by field effect, and are moved due to a bias voltage formed between the source and drain electrodes, whereby the electric current flows through the thin film transistor which then enters an on-state.

The semiconductor layer of the thin film transistor is generally made of a semiconductor material such as amorphous silicon or polysilicon. As the semiconductor layer is made of amorphous silicon, realizing circuits operating at a high speed is disadvantageously difficult due to low mobility. The semiconductor layer made of polysilicon has high mobility, but disadvantageously requires additional compensation circuits due to a non-uniform threshold voltage.

Conventional methods for fabricating a thin film transistor using low temperature poly-silicon (LTPS) are inapplicable to large substrates due to an expensive process such as laser thermal treatment, and the difficulty associated with controlling the characteristics of the thin film transistor. In order to address these problems, research into the use of oxide for a semiconductor layer is currently underway.

An oxide semiconductor layer generally exhibits superior mobility and high $I_{on}/I_{off}$ ratio, as compared to the silicon semiconductor layer. However, when the semiconductor layer is made entirely of oxide, the conductivity of a channel region thereof increases, and at the same time, the conductivity of a back channel thereof also increases. That is, when the oxide is used to form the entire semiconductor layer, the channel region and the back channel region of the semiconductor layer are made of the same composition. For this reason, as the conductivity in the channel region increases, the leakage current through the leakage channel generated in the back channel region in the off-state increases. On the other hand, if the conductivity were to be decreased in order to suppress the leakage current in the back channel region, the conductivity in the channel region also decreases, thus causing deterioration in the properties of the thin film transistor.

As such, when the semiconductor layer is made entirely of the same material such as oxide, a trade off is thus made between the channel region and the back channel region, which limits the improvement operation properties of the thin film transistor having such semiconductor layer.

SUMMARY OF THE INVENTION

Accordingly, the present invention is directed to a thin film transistor that substantially obviates one or more problems due to limitations and disadvantages of the related art.

It is one object of the present invention to provide a thin film transistor which increases the conductivity of a channel region and prevents the leakage current of a back channel region.

It is another object of the present invention to provide a display device such as a liquid crystal display device having a plurality of thin film transistors, which improves the characteristics of the display device.

To achieve these objects and other advantages and in accordance with the purpose of the invention, as embodied and broadly described herein, provided is a thin film transistor according to an embodiment comprising: a gate electrode arranged on a device substrate; a source electrode and a drain electrode spaced from each other on the substrate; a gate insulating film to insulate the gate electrode from the source electrode and the drain electrode; and a semiconductor layer insulated from the gate electrode through the gate insulating film, the semiconductor layer including a channel region and a back channel region, the semiconductor layer made of $(In_2O_3)_x(Ga_2O_3)_y(ZnO)_z$ ($0 \leq x \leq 5$, $0 \leq y \leq 5$, $0 \leq z \leq 5$), wherein X or Z is greater than Y in the channel region of the semiconductor layer, and Y is greater than X and Z in the back channel region of the semiconductor layer. According to an embodiment, X, Y, and Z can be any value, e.g., integers, rational numbers, etc.

The gate electrode may have a lower gate structure wherein the channel region is arranged under the semiconductor layer and the back channel region is arranged on the semiconductor layer. The gate electrode may have an upper gate structure wherein the back channel region is arranged under the semiconductor layer and the channel region is arranged on the semiconductor layer. Also, X may be greater than Z in the channel region of the semiconductor layer, or X may be equivalent to Z in the channel region of the semiconductor layer.

According to an embodiment, the gate electrode is arranged on the device substrate, the gate insulating film is arranged on the device substrate provided with the gate electrode, the source electrode and the drain electrode are arranged on the gate insulating film such that the source electrode and the drain electrode partially overlap the gate electrode, and the semiconductor layer is arranged on the gate insulating film such that the semiconductor layer covers the source electrode and the drain electrode.

According to an embodiment, the gate electrode is arranged on the device substrate, the gate insulating film is arranged on the device substrate provided with the gate electrode, the semiconductor layer is arranged on the gate insulating film such that the semiconductor layer overlaps the gate electrode, and the source electrode and the drain electrode are arranged on the semiconductor layer such that the source electrode and the drain electrode are spaced from each other and partially overlap the gate electrode.

According to an embodiment, the source electrode and the drain electrode are spaced from each other on the device substrate, the semiconductor layer is arranged on the device substrate such that the semiconductor layer covers the source electrode and the drain electrode, the gate insulating film is arranged on the device substrate provided with the semiconductor layer, and the gate electrode is arranged on the gate insulating film such that the gate electrode partially overlaps the source electrode and the drain electrode.

According to an embodiment, the semiconductor layer is arranged on the device substrate, the source electrode and the drain electrode are spaced from each other on the semiconductor layer, the gate insulating film is arranged on the semiconductor layer provided with the source electrode and the drain electrode, and the gate electrode is arranged on the gate insulating film such that the gate electrode partially overlaps the source electrode and the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE PREFERRED EMBODIMENTS

Hereinafter, a thin film transistor (TFT) according to various embodiments of the present invention will be described with reference to the annexed drawings.

The thin film transistor (TFT) according to an embodiment of the present invention includes a gate electrode, a gate insulating film, an oxide semiconductor layer, and a source electrode and a drain electrode which are spaced from each other. The oxide semiconductor layer is defined by a channel region and a back channel region.

The semiconductor layer may be formed with $ZnO$, $Ga_2O_3$, $In_2O_3$ or a combination thereof.

When the channel region of the semiconductor layer is arranged in a lower portion, the lower portion of the semiconductor layer contains more Zn or In (mol %) than Ga (mol %) to increase the conductivity of the channel region, and an upper portion of the semiconductor layer, where the back channel region is arranged, contains more Ga (mol %) than Zn and In (mol %) to decrease the conductivity of the back channel region.

Alternatively, when the channel region of the semiconductor layer is arranged in an upper portion, the upper portion of the semiconductor layer contains more Zn or In (mol %), than Ga (mol %), to increase conductivity of the channel region, the lower portion of the semiconductor layer where the back channel region is arranged contains more Ga (mol %) than Zn or In (mol %).

Hereinafter, preferred embodiments of the thin film transistor according to the invention will be discussed in detail.

Figure 1A:
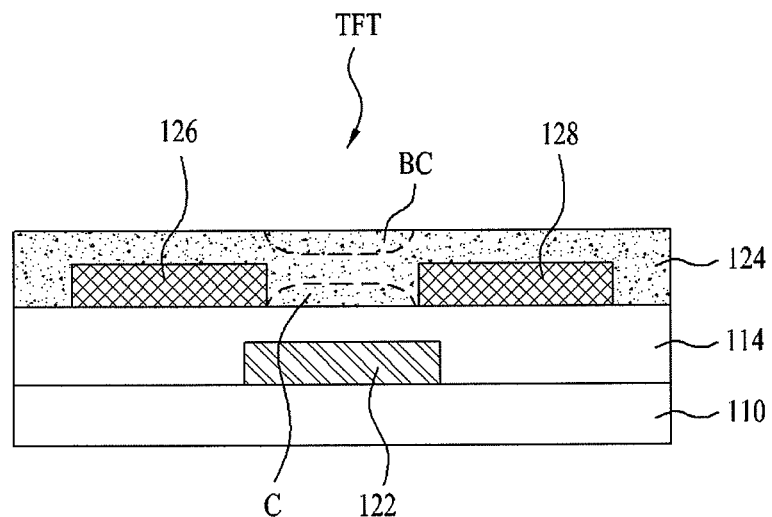
FIGS. 1A and 1B are sectional views illustrating a thin film transistor having a lower gate structure according to first and second embodiments of the present invention, respectively.
Figure 1B:
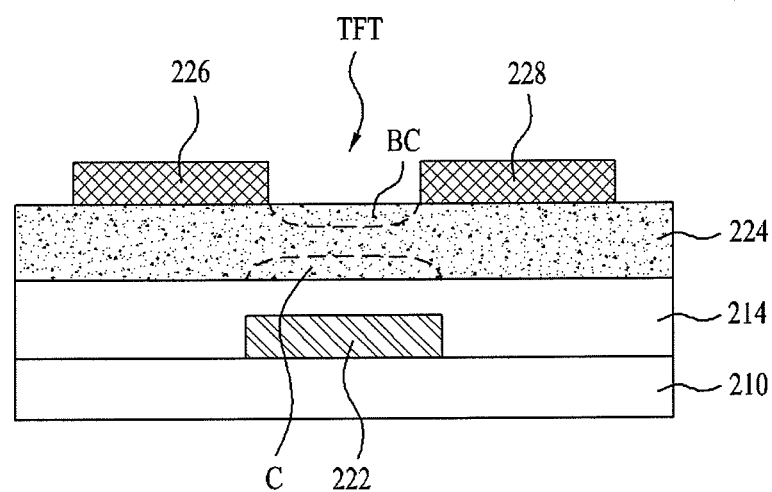
Figure 1C:
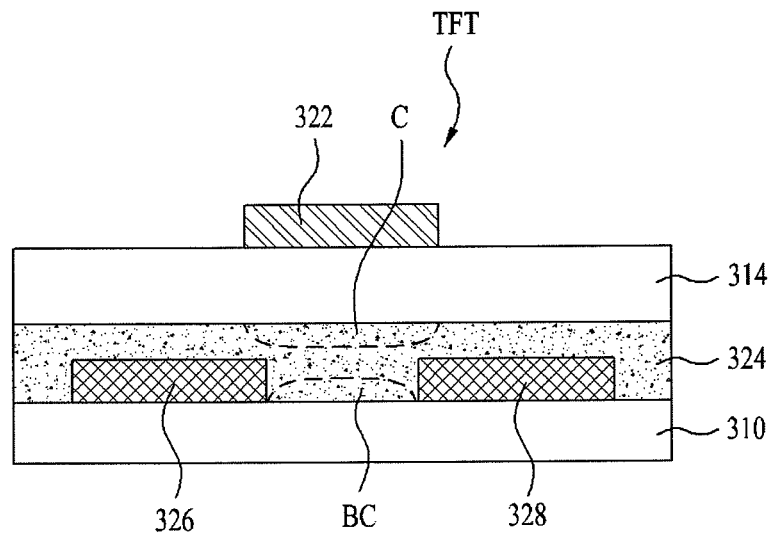
FIGS. 1C and 1D are sectional views illustrating a thin film transistor having an upper gate structure according to third and fourth embodiments of the present invention, respectively.
Figure 1D:
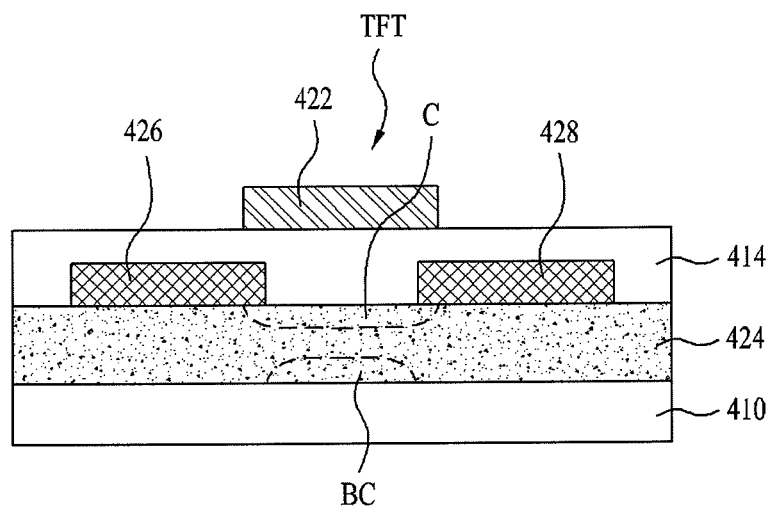

FIGS. 1A and 1B are sectional views illustrating a thin film transistor having a lower gate structure according to first and second embodiments of the present invention, respectively. FIGS. 1C and 1D are sectional views illustrating a thin film transistor having an upper gate structure according to third and fourth embodiments of the present invention, respectively.

Referring to FIG. 1A, the thin film transistor (TFT) provided with a lower gate structure according to the first embodiment includes a device substrate 110, a gate electrode 122 arranged on the device substrate 110, a gate insulating film 114 arranged on the gate electrode 122, and a source electrode 126 and a drain electrode 128 spaced from each other on the gate insulating film 114, and a semiconductor layer 124 to cover the source electrode 126 and the drain electrode 128. All the components of the thin film transistor are operatively configured. Further, in the first through fourth embodiment, the device substrate 110, 210, 310 or 410 can be a substrate in a display device such as LCD, PDP, ELD, FED, VFD or OLED, or other electronic device.

The gate electrode 122 is made of a metal and is in the form of, e.g., an island or other form. The metal constituting the gate electrode 122 may have a laminate structure.

The gate insulating film 114 is composed of a silicon nitride layer, an silicon oxide layer or a silicon nitride oxide layer over the entire surface of the device substrate 110 provided with the gate electrode 122. The gate insulating film 114 increases adhesion between the device substrate 110 and the gate insulating film 114, and prevents diffusion of impurities from the device substrate 110 to the semiconductor layer 124 and oxidation of the gate electrode 122.

The source electrode 126 and the drain electrode 128 are made of a metal and are spaced from each other on the gate insulating film 114. At this time, one end of the source electrode 126 and one end of the drain electrode 128 overlap the gate electrode 122. The metal constituting the source electrode 126 and the drain electrode 128 may have a laminate structure.

The semiconductor layer 124 is arranged on the gate insulating film 114 such that it covers the source electrode 126 and the drain electrode 128. The semiconductor layer 124 includes a lower region where a channel region (C) is formed between the source electrode 126 and the drain electrode 128 spaced from each other, and an upper region where a back channel region (BC) is formed.

The semiconductor layer 124 is formed of oxide. The oxide constituting the semiconductor layer 124 may be $(Ga_2O_3)_x(In_2O_3)_{1-x}$, $(In_2O_3)_x(ZnO)_{1-x}$, $(ZnO)_{1-x}$, $(Ga_2O_3)_{1-x}$ or $(In_2O_3)_x(Ga_2O_3)_y(ZnO)_z$ in which $0 \le x \le 5$, $0 \le y \le 5$, $0 \le z \le 5$. Here, x, y and z can be any value, e.g., integers, rational numbers, etc.

According to the second embodiment, referring to FIG. 1B, a thin film transistor (TFT) with a lower gate structure includes a device substrate 210, a gate electrode 222 arranged on the device substrate 210, a gate insulating film 214 arranged on the gate electrode 222, a semiconductor layer 224 overlapping the gate electrode 222 on the gate insulating film 214 and a source electrode 226 and a drain electrode 228) spaced from each other on the semiconductor layer 224. All components of the thin film transistor of FIG. 1B are operatively configured.

The gate electrode 222 may be made of a metal and in the form of, e.g., an island or other form. The metal constituting the gate electrode 222 may have a laminate structure. The gate insulating film 214 is composed of a silicon nitride layer, an silicon oxide layer or a nitride-silicon oxide layer over the entire surface provided with the gate electrode 222.

The semiconductor layer 224 is arranged on the gate insulating film 214 such that the semiconductor layer 224 overlaps the gate electrode 222. The semiconductor layer 224 includes a lower region including a channel region (C) in which the semiconductor layer 224 overlaps the gate electrode 222, and an upper region where a back channel region (BC) is formed in the semiconductor layer 224 between the source electrode 226 and the drain electrode 228 spaced from each other.

The semiconductor layer 224 is formed of oxide. The oxide constituting the semiconductor layer 224 may be $(Ga_2O_3)_x(In_2O_3)_{1-x}$, $(In_2O_3)_x(ZnO)_{1-x}$, $(ZnO)_x(Ga_2O_3)_{1-x}$ or $(In_2O_3)_x(Ga_2O_3)_y(ZnO)_z$ in which $0 \leq x \leq 5$, $0 \leq y \leq 5$, $0 \leq z \leq 5$. Here, x, y and z can be any value, e.g., integers, rational numbers, etc.

The source electrode 226 and the drain electrode 228 are made of a metal and are spaced from each other on the semiconductor layer 224. At this time, one end of the source electrode 226 and one end of the drain electrode 228 overlap the gate electrode 222. The metal constituting the source electrode 226 and the drain electrode 228 may have a laminate structure.

According to the third embodiment, referring to FIG. 1C, a thin film transistor (TFT) with an upper gate structure includes a source electrode 326 and a drain electrode 328 which are spaced from each other on a device substrate 310, a semiconductor layer 324 arranged on the device substrate 310 such that it overlaps or covers the source electrode 326 and the drain electrode 328, a gate insulating film 314 arranged on the semiconductor layer 324, and a gate electrode 322 arranged on the gate insulating film 314 such that the gate electrode 322 partially overlaps the source electrode 326 and the drain electrode 328 arranged over the entire surface of the device substrate 310.

The source electrode 326 and the drain electrode 328 are made of a metal and are spaced from each other on the device substrate 310. One end of the source electrode 326 and one end of the drain electrode 328 overlap the gate electrode 222 by being disposed underneath the gate electrode 322. The metal constituting the source electrode 226 and the drain electrode 328 may have a laminate structure.

The semiconductor layer 324 is made of oxide and is arranged on the device substrate 310 such that it overlaps or covers the source electrode 326 and the drain electrode 328. The semiconductor layer 324 includes a lower region where a back channel region (BC) is arranged between the source electrode 326 and the drain electrode 328 spaced from each other, and an upper region including a channel region C contacting the gate insulating film 314.

The oxide constituting the semiconductor layer 324 may be $(Ga_2O_3)_x(In_2O_3)_{1-x}$, $(In_2O_3)_x(ZnO)_{1-x}$, $(ZnO)_x(Ga_2O_3)_{1-x}$ or $(In_2O_3)_x(Ga_2O_3)_y(ZnO)_z$ in which $0 \leq x \leq 5$, $0 \leq y \leq 5$, $0 \leq z \leq 5$. Here, x, y and z can be any value, e.g., integers, rational numbers, etc.

The gate insulating film 314 is formed of a silicon nitride layer, an silicon oxide layer or a silicon nitride oxide layer over the entire surface of the device substrate 310 provided with the source electrode 326 and the drain electrode 328 and the semiconductor layer 314. The gate electrode 322 is formed in the form of, e.g., an island or other form, on the semiconductor layer 324 such that it partially overlaps the source electrode 326 and the drain electrode 328. The metal constituting the gate electrode 322 may have a laminate structure.

According to the fourth embodiment, referring to FIG. 1D, a thin film transistor (TFT) with an upper gate structure includes a device substrate 410, a semiconductor layer 424 arranged on the device substrate 410, a source electrode 426 and a drain electrode 428 spaced from each other on the semiconductor layer 424, a gate insulating film 414 arranged on the semiconductor layer 424 provided with a source electrode 426 and a drain electrode 428, and a gate electrode 422 arranged on the gate insulating film 414 such that it partially overlaps the source electrode 426 and the drain electrode 428 arranged on the semiconductor layer 424.

The semiconductor layer 424 is made of oxide and is formed on the device substrate 410. The semiconductor layer 424 includes a lower region where a back channel region (BC) is formed, and an upper region where a channel region (C) contacts the gate insulating film 414 arranged between and over the source electrode 426 and the drain electrode 428 spaced from each other.

The oxide constituting the semiconductor layer 324 may be $(Ga_2O_3)_x(In_2O_3)_{1-x}$, $(In_2O_3)_x(ZnO)_{1-x}$, $(ZnO)_x(Ga_2O_3)_{1-x}$ or $(In_2O_3)_x(Ga_2O_3)_y(ZnO)_z$ in which $0 \leq x \leq 5$, $0 \leq y \leq 5$, $0 \leq z \leq 5$. Here, x, y and z can be any value, e.g., integers, rational numbers, etc.

The source electrode 426 and the drain electrode 428 are made of a metal and are spaced from each other on the gate insulating film 414. One end of the source electrode 426 and one end of the drain electrode 428 overlap the gate electrode 422. The metal constituting the source electrode 426 and the drain electrode 428 may have a laminate structure.

The gate insulating film 414 is formed using a silicon nitride layer, a silicon oxide layer or a silicon nitride oxide layer over the entire surface of the device substrate 410. The gate electrode 422 is formed in the form of, e.g., an island or other form, on the semiconductor layer 424 such that it partially overlaps the source electrode 426 and the drain electrode 428. The metal constituting the gate electrode 422 may have a laminate structure.

In the various embodiments of the invention, the semiconductor layer (e.g., 124, 224, 324, 424) may be formed using known techniques. For instance, the semiconductor layer may be applied on the gate insulating layer or substrate using a coating method. In that case, different materials may be mixedly applied during the coating process to provide the semiconductor layer having the first and second regions respectively composed of different materials. In an example, while a first material for the semiconductor layer is being coated on the gate insulating layer or substrate, a second material for the semiconductor layer may then be added to selectively coat the gate insulating layer or substrate with the mixture of the first and second materials in certain regions. As a result, the semiconductor layer of the invention can be formed. In another example, first and second semiconductor sublayers having different materials may be formed on the gate insulating layer or substrate, to provide the semiconductor layer of the invention.

Figure 2:
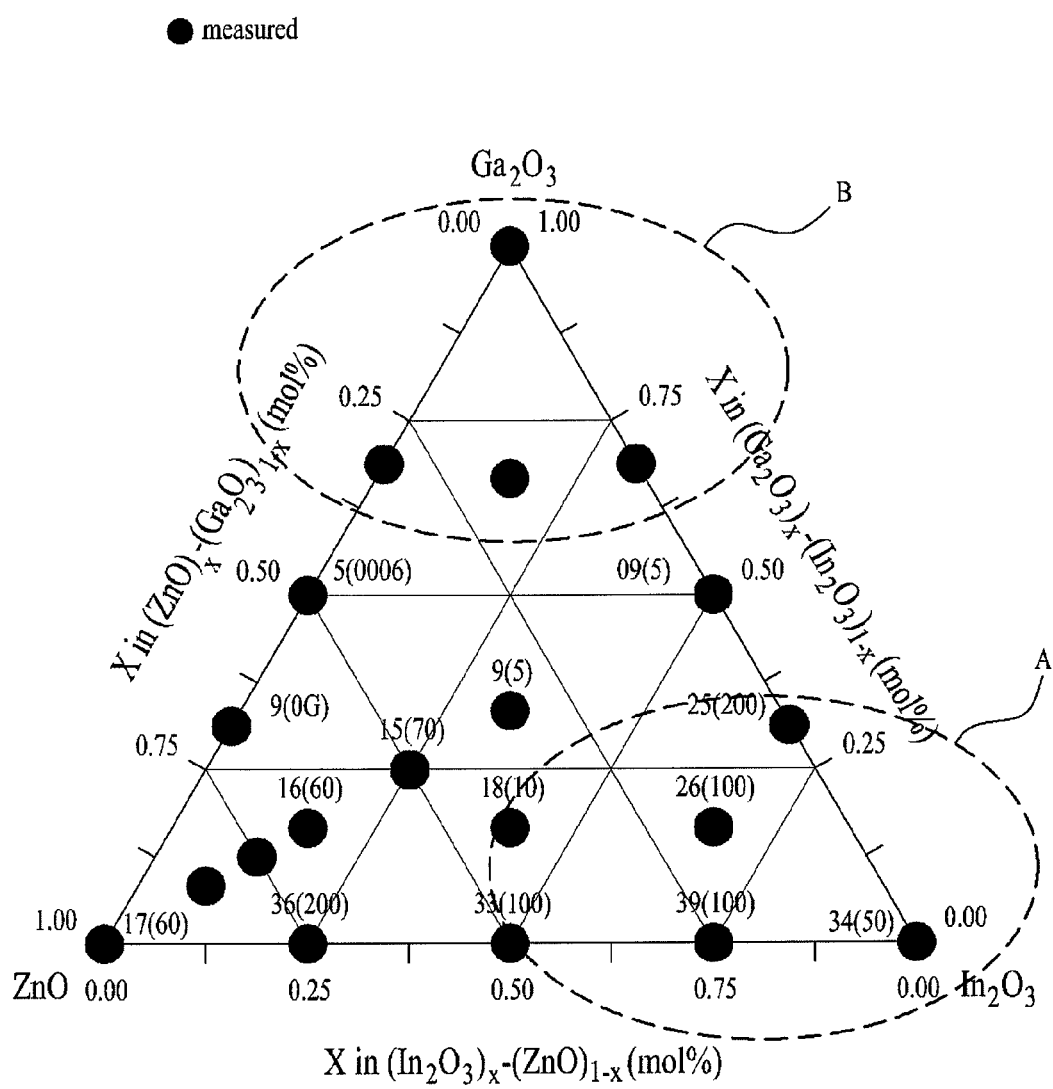
FIG. 2 is an example of a graph mapping mobility and carrier level by hall effects in a 3-component system of $In_2O_3$—$ZnO$—$Ga_2O_3$ according to an embodiment of the invention.

FIG. 2 is an example of a graph mapping mobility and carrier level by hall effects in a 3-component system of $In_2O_3$—$ZnO$—$Ga_2O_3$ according to an embodiment of the invention. The graph is generated based on certain measured values obtained during experiments where the value of X is varied.

Referring to FIG. 2, as In and Zn increase, mobility and carrier level increase. As Ga increases, mobility and carrier level decrease. Accordingly, with respect to the thin film transistor with the lower gate structure according to the first and second embodiments of the present invention, the lower region of the semiconductor layer 124 or 224 contains a larger amount of A region ingredient based on the channel region (C), and the upper region of the semiconductor layer 124 or 224 contains a larger amount of B region ingredient based on the back channel region (BC).

That is, with respect to the thin film transistor with the lower gate structure according to the first and second embodiments, the lower region of the semiconductor layer 124 or 224 contains more AZnO or $In_2O_3$ (mol %) than $Ga_2O_3$ (mol %), based on the channel region (C), and the upper region of the semiconductor layer 124 or 224 contains more $Ga_2O_3$ (mol %) than ZnO or $In_2O_3$ (mol %), based on the back channel region (C).

Specifically, when the semiconductor layer 124 or 224 is composed of $(In_2O_3)_x(ZnO)_{1-x}$, the lower region of the semiconductor layer 124 based on the channel region (C) contains $In_2O_3$ (mol %) in an amount equivalent to or larger than ZnO (mol %).

Also, when the semiconductor layer 124 or 224 is composed of $(Ga_2O_3)_x(In_2O_3)_{1-x}$, the lower region of the semiconductor layer 124 or 224, based on the channel region (C), contains more $In_2O_3$ (mol %) than $Ga_2O_3$ (mol %), and the upper region of the semiconductor layer 124 or 224 based on the back channel region (BC) contains more $Ga_2O_3$ (mol %) than $In_2O_3$ (mol %).

Also, when the semiconductor layer 124 or 224 is composed of $(ZnO)_x(Ga_2O_3)_{1-x}$, the lower region of the semiconductor layer 124 or 224, based on the channel region (C) contains more ZnO (mol %) than $Ga_2O_3$ (mol %), and the upper region of the semiconductor layer 124 or 224 based on the back channel region (BC) contains more $Ga_2O_3$ (mol %) than ZnO (mol %).

Also, when the semiconductor layer 124 or 224 is composed of $(In_2O_3)_x(ZnO)_y(Ga_2O_3)_z$, the lower region of the semiconductor layer 124 or 224, based on the channel region, (C) contains more ZnO (mol %) than $Ga_2O_3$ (mol %), and the upper region of the semiconductor layer 124 or 224, based on the back channel region (BC), contains more $Ga_2O_3$ (mol %) than $In_2O_3$ (mol %) or ZnO (mol %).

For the oxide constituting the semiconductor layer 124 or 224, the graph of FIG. 2 uses x, y and z as follows: $0 \leq x \leq 5$, $0 \leq y \leq 5$, $0 \leq z \leq 5$.

With respect to the thin film transistor with the upper gate structure according to the third and fourth embodiments of the present invention, the upper region of the semiconductor layer 324 or 424, based on the channel region (C), contains a larger amount of A region ingredient and a lower region thereof, based on the back channel region (BC), contains a larger amount of B region ingredient. That is, the upper region of the semiconductor layer 324 or 424, based on the channel region (C), contains more ZnO or $In_2O_3$ (mol %) than $Ga_2O_3$ (mol %) and the lower region of the semiconductor layer 324 or 424, based on the back channel region (BC), contains more $Ga_2O_3$ (mol %) than ZnO or $In_2O_3$ (mol %)

Specifically, when the semiconductor layer 324 or 424 is composed of $(In_2O_3)_x(ZnO)_{1-x}$, the upper region of the semiconductor layer 324 or 424, based on the channel region (C), contains $In_2O_3$ (mol %) in an amount equivalent to or larger than ZnO (mol %).

Also, when the semiconductor layer 324 or 424 is composed of $(Ga_2O_3)_x(In_2O_3)_{1-x}$, the upper region of the semiconductor layer 324 or 424, based on the channel region (C), contains more $In_2O_3$ (mol %) than $Ga_2O_3$ (mol %), and the lower region of the semiconductor layer 324 or 424, based on the back channel region (BC), contains more $Ga_2O_3$ (mol %) than $In_2O_3$ (mol %).

Also, when the semiconductor layer 324 or 424 is composed of $(ZnO)_x(Ga_2O_3)_{1-x}$, the upper region of the semiconductor layer 324 or 424, based on the channel region (C) contains more ZnO (mol %) than $Ga_2O_3$ (mol %), and the lower region of the semiconductor layer 324 or 424, based on the back channel region (BC), contains more $Ga_2O_3$ (mol %) than ZnO (mol %).

Also, when the semiconductor layer 324 or 424 is composed of $(In_2O_3)_x(ZnO)_y(Ga_2O_3)_z$, the upper region of the semiconductor layer 324 or 424, based on the channel region (C) contains more $In_2O_3$ or ZnO (mol %) than $Ga_2O_3$ (mol %), and the lower region of the semiconductor layer 324 or 424, based on the back channel region (BC), contains more $Ga_2O_3$ (mol %) than $In_2O_3$ (mol %) or ZnO (mol %).

In the oxide constituting the semiconductor layer 324 or 424, the graph of FIG. 2 uses x, y and z as follows: $0 \leq x \leq 5$, $0 \leq y \leq 5$, $0 \leq z \leq 5$.

As such, the thin film transistor (TFT) having a lower gate structure contains more Zn or In (to increase mobility and a carrier level) than Ga in a lower region of the semiconductor layer, based on the channel region (C), and contains more Ga (having a higher bonding strength with oxygen) than In or Zn in an upper region of the semiconductor layer based on the back channel region (BC).

Also, the thin film transistor (TFT) having an upper gate structure contains more Zn or In (to increase mobility and carrier level) than Ga in a upper region of the semiconductor layer, based on the channel region (C), and contains more Ga (to decrease mobility and carrier level) than In or Zn in a lower region of the semiconductor layer based on the back channel region (BC).

Accordingly, with respect to the thin film transistor having the upper gate structure and the thin film transistor having the lower gate structure of the present invention, as conductivity in the channel region (C) of the semiconductor layer increases, the production of carriers caused by oxygen loss in the back channel region (BC) of the semiconductor layer in an off state is suppressed and the leakage current through a leakage channel is decreased, thus improving the properties of the thin film transistor (TFT).

Meanwhile, the channel region (C) and the back channel region (BC) of the semiconductor layers 124, 224, 324 or 424 are not limited to dots shown in the drawings and may be widened or of different shape and/or size.

Figure 3:
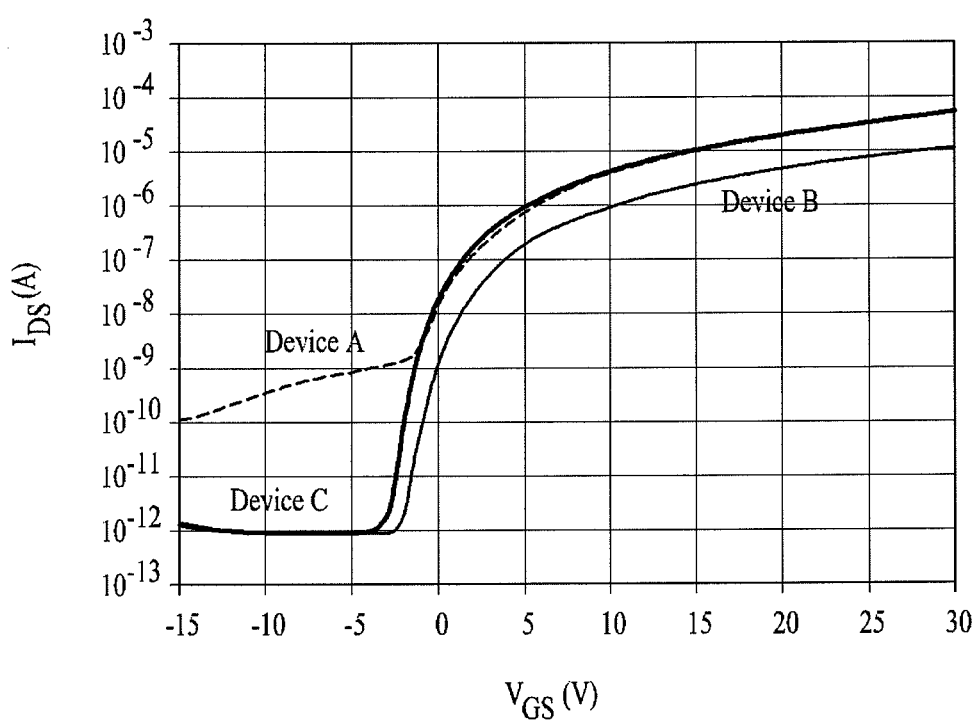
FIG. 3 is an example of a graph comparing effects of the related art and an example of the present invention.

FIG. 3 is an example of a graph comparing effects of a thin film transistor (Devices A and B) according to the related art with a thin film transistor (Device C) according to an example of the present invention. Referring to FIG. 3, a thin film transistor (Device C) according to an example of the present invention includes a semiconductor layer having lower and upper regions as discussed above, wherein the lower region provided with the channel region is made of, e.g., $(In_2O_3)_4(ZnO)_4(Ga_2O_3)_1$ and the upper region provided with the back channel region is made of, e.g., $(In_2O_3)_{1.7}(ZnO)_{3.3}(Ga_2O_3)_5$. The thin film transistor (Device C) of the invention in this example exhibits low off current, as compared to Device A of the related art wherein the entire region of the semiconductor layer is made of $(In_2O_3)_4(ZnO)_4(Ga_2O_3)_1$, and exhibits high off current, as compared to Device B of the related art wherein the entire region of the semiconductor layer is made of $(In_2O_3)_{1.7}(ZnO)_{3.3}(Ga_2O_3)_5$.

Accordingly, the thin film transistor of the present invention increases on-current and mobility and suppresses leakage current, thus improving the operation properties of the thin film transistor.

The gate structure of the thin film transistor according to the invention is not limited to that of the afore-mentioned embodiments and may be a single gate or a double gate. The thin film transistor according to the invention may be utilized in integrated circuits or structures including the same such as display panels (for example, flat display panels such as LCD, PDP, ELD, FED, VFD or OLED). For instance, an LCD according to the present invention includes a plurality of the TFTs discussed above according to any embodiment of the invention, and other components which are known, e.g., data lines, gate lines, pixel regions, a liquid crystal layer, a black matrix layer, color filters, etc. Similarly, a PDP, ELD, FED, VFD or OLED includes a plurality of the TFTs discussed above according to any embodiment of the invention, and other components which are known.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor comprising:
a gate electrode arranged on a substrate;
a source electrode and a drain electrode spaced from each other on the substrate;
a gate insulating film to insulate the gate electrode from the source electrode and the drain electrode; and
a semiconductor layer insulated from the gate electrode by the gate insulating film, the semiconductor layer including a first region and a second region, the semiconductor layer made of $(In_2O_3)_x(Ga_2O_3)_y(ZnO)_z (0 \leq x \leq 5, 0 \leq y \leq 5, 0 \leq z \leq 5)$,
wherein:
X or Z is greater than Y in the first region of the semiconductor layer,
Y is greater than X and Z in the second region of the semiconductor layer,
the first region of the semiconductor layer, in which X or Z is greater than Y, is a channel region which is a first distance from the gate electrode,
the second region of the semiconductor layer, in which Y is greater than X and Z, is a back channel region which is a second distance from the gate electrode, the second distance being larger than the first distance, and at least one of X and Z is not zero in the second region of the semiconductor layer, and
an amount of each of In, Zn and Ga in the first region of the semiconductor layer is different from an amount of each of In, Zn and Ga in the second region of the semiconductor layer.

2. The thin film transistor according to claim 1, wherein the gate electrode has a lower gate structure wherein the channel region is arranged in the semiconductor layer between the source and drain electrodes and the back channel region is arranged above the channel region.

3. The thin film transistor according to claim 1, wherein X is greater than Z in the first region of the semiconductor layer.

4. The thin film transistor according to claim 1, wherein X is equivalent to Z in the first region of the semiconductor layer.

5. The thin film transistor according to claim 1, wherein
the gate insulating film is arranged on the substrate provided with the gate electrode,
the source electrode and the drain electrode are arranged on the gate insulating film, wherein the source electrode and the drain electrode partially overlap the gate electrode, and
the semiconductor layer is arranged on the gate insulating film, wherein the semiconductor layer covers the source electrode and the drain electrode.

6. The thin film transistor according to claim 1, wherein
the gate insulating film is arranged on the substrate provided with the gate electrode,
the semiconductor layer is arranged on the gate insulating film, wherein the semiconductor layer overlaps the gate electrode, and
the source electrode and the drain electrode are arranged on the semiconductor layer, wherein the source electrode and the drain electrode are spaced from each other and partially overlap the gate electrode.

7. A thin film transistor comprising:
a gate electrode arranged on a substrate;
a source electrode and a drain electrode spaced from each other on the substrate;
a gate insulating film to insulate the gate electrode from the source electrode and the drain electrode; and
a semiconductor layer insulated from the gate electrode by the gate insulating film, the semiconductor layer including a first region and a second region,
wherein:
the first region contains more of at least one of ZnO and $In_2O_3$ than $Ga_2O_3$,
the second region contains more $Ga_2O_3$ than at least one of ZnO and $In_2O_3$,
the first region, which contains more of at least one of ZnO and $In_2O_3$ than $Ga_2O_3$, is a channel region which is a first distance from the gate electrode,
the second region, which contains more $Ga_2O_3$ than at least one of ZnO and $In_2O_3$, is a back channel region which is a second distance from the gate electrode, the second distance being larger than the first distance, and an amount of at least one of ZnO and $In_2O_3$ is not zero in the second region, and
an amount of each of In, Zn and Ga in the first region is different from an amount of each of In, Zn and Ga in the second region.

8. A display device comprising:
a display panel including a plurality of thin film transistors, each of the thin film transistors including:
a gate electrode arranged on a substrate;
a source electrode and a drain electrode spaced from each other on the substrate;
a gate insulating layer to insulate the gate electrode from the source electrode and the drain electrode; and
a semiconductor layer insulated from the gate electrode by the gate insulating layer, the semiconductor layer including a first region and a second region,
wherein:
the first region contains more of at least one of ZnO and $In_2O_3$ than $Ga_2O_3$, and
the second region contains more $Ga_2O_3$ than at least one of ZnO and $In_2O_3$, the first region, which contains more of at least one of ZnO and $In_2O_3$ than $Ga_2O_3$, is a channel region which is a first distance from the gate electrode, the second region, which contains more $Ga_2O_3$ than at least one of ZnO and $In_2O_3$, is a back channel region which is a second distance from the gate electrode, the second distance being larger than the first distance, and an amount of at least one of ZnO and $In_2O_3$ is not zero in the second region, and an amount of each of In, Zn and Ga in the first region is different from an amount of each of In, Zn and Ga in the second region.

9. The display device according to claim 8, each of the thin film transistors including:

the gate electrode formed on the substrate; and the gate insulating layer covering the gate electrode, wherein the gate electrode is below the source and drain electrodes.

10. The display device according to claim 9, wherein the source and drain electrodes are formed on the gate insulating layer and covered by the semiconductor layer, and the channel region in the semiconductor layer is formed between the source and drain electrodes at a lower portion of the semiconductor layer.

11. The display device according to claim 9, wherein the semiconductor layer is formed on the gate insulating layer and the source and drain electrodes are formed on the semiconductor layer, and the channel region is formed at a lower portion of the semiconductor layer.

* * * * *